(12) United States Patent
McGowan

(10) Patent No.: US 6,362,649 B1
(45) Date of Patent: Mar. 26, 2002

(54) FIELD PROGRAMMABLE GATE ARRAY WITH MASK PROGRAMMED INPUT AND OUTPUT BUFFERS

(75) Inventor: John E. McGowan, Sunnyvale, CA (US)

(73) Assignee: Actel Corporation, Sunnyvale, CA (US)

( * ) Notice: Subject to any disclaimer, the term of this patent is extended or adjusted under 35 U.S.C. 154(b) by 0 days.

(21) Appl. No.: 09/286,128

(22) Filed: Apr. 2, 1999

Related U.S. Application Data

(63) Continuation of application No. 08/792,482, filed on Jan. 31, 1997, now Pat. No. 5,959,466.

(51) Int. Cl.$^7$ ............................................. H03K 19/177
(52) U.S. Cl. ............................... 326/41; 326/39; 326/40
(58) Field of Search ............................. 326/39, 38, 37, 326/40, 41

(56) References Cited

U.S. PATENT DOCUMENTS

| 4,195,352 A | 3/1980 | Tu et al. ...................... 364/900 |
| 4,458,163 A | 7/1984 | Wheeler et al. ............. 307/466 |
| 4,527,115 A | 7/1985 | Mehrotra et al. ............. 324/73 |
| 4,609,986 A | 9/1986 | Hartmann et al. ........... 364/200 |
| 4,631,686 A | 12/1986 | Ikawa et al. ................. 364/490 |
| 4,677,318 A | 6/1987 | Veenstra ...................... 307/465 |

(List continued on next page.)

FOREIGN PATENT DOCUMENTS

| EP | 0 069 762 | 1/1983 |
| EP | 0 081 917 | 6/1983 |

(List continued on next page.)

OTHER PUBLICATIONS

"Mixture of Field and Factory Programmed Logic Cells in a Single Device," IBM Technical Disclosure Bulletin, vol. 38, No. 04, April 1995, p. 499.

(List continued on next page.)

Primary Examiner—Michael Tokar
Assistant Examiner—Vibol Tan
(74) Attorney, Agent, or Firm—Sierra Patent Group, Ltd

(57) ABSTRACT

A hybrid integrated circuit architecture comprising a mask programmable portion and a field programmable gate array portion. The mask programmable portion has a plurality of mask programmed input and output buffer circuits, and a first group of input/output pads, wherein one of the input/output pads of the first group is connected to an input of one of the input buffer circuits, and one of the input/output pads of the first group is connected to an output of one of the output buffer circuits. The field programmable gate array portion has programmable digital logic function modules, a second group of input/output pads, interconnect conductors divided into one or more segments, wherein some segments run in a first direction and some segments run in a second direction to form intersections and some segments form intersections with inputs and outputs of the digital logic function modules, the first group of input/output pads, and inputs and outputs of the output and input buffer circuits from the mask programmable portion, and user programmable interconnect elements connected between adjoining ones of the segments in a same one of the interconnect conductors, and between intersections of selected ones the first and second segments, intersections of inputs and outputs of the digital logic function modules and selected interconnect conductors, intersections of the first group of input/output pads and selected ones of the interconnect conductors, intersections with outputs of the input buffer circuits and selected ones of the interconnect conductors, and intersections with the inputs of the output buffer circuits and selected ones of the interconnect conductors.

21 Claims, 6 Drawing Sheets

U.S. PATENT DOCUMENTS

| | | | |
|---|---|---|---|
| 4,684,830 A | 8/1987 | Tsui et al. | 307/465 |
| 4,691,161 A | 9/1987 | Kant et al. | 324/73 |
| 4,713,792 A | 12/1987 | Hartmann et al. | 364/900 |
| 4,718,057 A | 1/1988 | Venkitakrishnan et al. | 370/55 |
| 4,721,868 A | 1/1988 | Cornell et al. | 307/465 |
| 4,758,747 A | 7/1988 | Young et al. | 307/465 |
| 4,771,285 A | 9/1988 | Agrawal et al. | 340/825.83 |
| 4,772,811 A | 9/1988 | Fujioka et al. | 307/465 |
| 4,774,421 A | 9/1988 | Hartmann et al. | 307/465 |
| 4,783,606 A | 11/1988 | Goetting | 307/465 |
| 4,847,612 A | 7/1989 | Kaplinsky | 340/825.8 |
| 4,857,774 A | 8/1989 | El-Ayat et al. | 307/465 |
| 4,910,466 A | 3/1990 | Kiuchi et al. | 328/137 |
| 4,912,345 A | 3/1990 | Steele et al. | 307/465 |
| 4,931,671 A | 6/1990 | Agrawal | 307/465 |
| 4,933,577 A | 6/1990 | Wong et al. | 307/465 |
| 4,933,898 A | 6/1990 | Gilberg et al. | 365/53 |
| 4,940,909 A | 7/1990 | Mulder et al. | 307/465 |
| 4,952,934 A | 8/1990 | Chiriatti | 341/142 |
| 4,963,768 A | 10/1990 | Agrawal et al. | 307/465 |
| 4,969,121 A | 11/1990 | Chan et al. | 364/900 |
| 4,983,959 A | 1/1991 | Breuninger | 340/825.83 |
| 4,992,680 A | 2/1991 | Benedetti et al. | 307/465 |
| 5,023,484 A | 6/1991 | Pathak et al. | 307/465 |
| 5,027,011 A | 6/1991 | Steele | 307/465 |
| 5,028,821 A | 7/1991 | Kaplinsky | 307/465 |
| 5,045,726 A | 9/1991 | Leung | 307/466 |
| 5,068,603 A | 11/1991 | Mahoney | 324/158 |
| 5,083,293 A | 1/1992 | Gilberg et al. | 365/189.01 |
| 5,107,146 A | 4/1992 | El-Ayat | 307/465 |
| 5,140,193 A | 8/1992 | Freeman, deceased, et al. | 307/465 |
| 5,151,623 A | 9/1992 | Agrawal | 307/465 |
| 5,153,462 A | 10/1992 | Agrawal et al. | 307/465 |
| 5,166,557 A | 11/1992 | Chen et al. | 307/468 |
| 5,191,242 A | 3/1993 | Agrawal et al. | 307/465 |
| 5,220,213 A | 6/1993 | Chan et al. | 307/465 |
| 5,221,865 A | 6/1993 | Phillips et al. | 307/465 |
| 5,225,719 A | 7/1993 | Agrawal et al. | 307/465 |
| 5,231,588 A | 7/1993 | Agrawal et al. | 364/489 |
| 5,258,891 A | 11/1993 | Sako | 361/792 |
| 5,301,143 A | 4/1994 | Ohri et al. | 365/96 |
| 5,311,080 A | 5/1994 | Britton et al. | 307/465 |
| 5,313,119 A | 5/1994 | Cooke et al. | 307/465 |
| 5,317,212 A | 5/1994 | Wahlstrom | 307/465 |
| 5,317,698 A | 5/1994 | Chan | 395/325 |
| 5,323,069 A | 6/1994 | Smith, Jr. | 307/465.1 |
| 5,329,181 A | 7/1994 | Ridgeway | 307/465 |
| 5,336,950 A | 8/1994 | Popli et al. | 307/465 |
| 5,341,040 A | 8/1994 | Garverick et al. | 307/443 |
| 5,343,406 A | 8/1994 | Freeman et al. | 364/490 |
| 5,349,249 A | 9/1994 | Chiang et al. | 307/465 |
| 5,357,153 A | 10/1994 | Chiang et al. | 307/465 |
| 5,375,086 A | 12/1994 | Wahlstrom | 365/149 |
| 5,377,124 A | 12/1994 | Mohsen | 364/489 |
| 5,381,058 A | 1/1995 | Britton et al. | 326/41 |
| 5,394,031 A | 2/1995 | Britton et al. | 326/38 |
| 5,402,014 A | 3/1995 | Ziklik et al. | 326/37 |
| 5,404,033 A | 4/1995 | Wong et al. | 257/202 |
| 5,414,638 A | 5/1995 | Verheyen et al. | 364/489 |
| 5,424,589 A | 6/1995 | Dobbelaere et al. | 326/41 |
| 5,424,655 A | 6/1995 | Chua | 326/40 |
| 5,426,335 A | 6/1995 | Agrawal et al. | 326/39 |
| 5,426,378 A | 6/1995 | Ong | 326/39 |
| 5,426,379 A | 6/1995 | Trimberger | 326/39 |
| 5,438,166 A | 8/1995 | Carey et al. | 174/261 |
| 5,440,453 A | 8/1995 | Cooke et al. | 361/790 |
| 5,444,394 A | 8/1995 | Watson et al. | 326/45 |
| 5,448,493 A | 9/1995 | Topolewski et al. | 364/489 |
| 5,452,229 A | 9/1995 | Shankar et al. | 364/489 |
| 5,457,409 A | 10/1995 | Agrawal et al. | 326/39 |
| 5,457,410 A | 10/1995 | Ting | 326/41 |
| 5,457,644 A | 10/1995 | McCollum | 364/716 |
| 5,469,003 A | 11/1995 | Kean | 326/39 |
| 5,477,167 A | 12/1995 | Chua | 326/41 |
| 5,485,104 A | 1/1996 | Agrawal et al. | 326/38 |
| 5,488,317 A | 1/1996 | Webster et al. | 326/45 |
| 5,490,042 A | 2/1996 | Perkins | 361/778 |
| 5,493,239 A | 2/1996 | Zlotknick | 326/38 |
| 5,498,886 A | 3/1996 | Hsu et al. | 257/213 |
| 5,500,609 A | 3/1996 | Kean | 326/41 |
| 5,504,354 A | 4/1996 | Mohsen | 257/209 |
| 5,504,439 A | 4/1996 | Tavana | 326/38 |
| 5,509,128 A * | 4/1996 | Chan | 395/311 |
| 5,521,529 A | 5/1996 | Agrawal et al. | 326/41 |
| 5,528,176 A | 6/1996 | Kean | 326/105 |
| 5,530,378 A | 6/1996 | Kucharewski, Jr. et al. | 326/41 |
| 5,534,798 A | 7/1996 | Phillips et al. | 326/108 |
| 5,537,341 A | 7/1996 | Rose et al. | 364/579 |
| 5,539,692 A | 7/1996 | Kajigaya et al. | 365/189.01 |
| 5,543,730 A | 8/1996 | Cliff et al. | 326/38 |
| 5,544,069 A | 8/1996 | Mohsen | 364/489 |
| 5,548,228 A | 8/1996 | Madurawe | 326/41 |
| 5,548,552 A | 8/1996 | Madurawe | 365/185.33 |
| 5,550,839 A | 8/1996 | Buch et al. | 371/22.1 |
| 5,552,722 A | 9/1996 | Kean | 326/41 |
| 5,559,447 A | 9/1996 | Rees | 326/30 |
| 5,559,465 A | 9/1996 | Shah | 327/374 |
| 5,563,526 A | 10/1996 | Hastings et al. | 326/37 |
| 5,563,528 A | 10/1996 | Diba et al. | 326/39 |
| 5,563,592 A | 10/1996 | Cliff et al. | 341/63 |
| 5,565,792 A | 10/1996 | Chiang et al. | 326/40 |
| 5,565,793 A | 10/1996 | Pedersen | 326/41 |
| 5,568,081 A | 10/1996 | Liu et al. | 327/380 |
| 5,570,040 A | 10/1996 | Lytle et al. | 326/41 |
| 5,572,148 A | 11/1996 | Lytle et al. | 326/41 |
| 5,572,409 A | 11/1996 | Nathan et al. | 361/806 |
| 5,576,554 A | 11/1996 | Hsu | 257/48 |
| 5,577,050 A | 11/1996 | Bair et al. | 371/10.2 |
| 5,581,198 A | 12/1996 | Trimberger | 326/38 |
| 5,581,501 A | 12/1996 | Sansbury et al. | 365/185.01 |
| 5,583,450 A | 12/1996 | Trimberger et al. | 326/41 |
| 5,583,452 A | 12/1996 | Duong et al. | 326/49 |
| 5,583,749 A | 12/1996 | Tredennick et al. | 361/790 |
| 5,587,669 A | 12/1996 | Chan et al. | 326/38 |
| 5,590,305 A | 12/1996 | Terrill et al. | 395/430 |
| 5,592,509 A | 1/1997 | McClear et al. | 375/219 |
| 5,592,632 A | 1/1997 | Leung et al. | 395/306 |
| 5,594,365 A | 1/1997 | Agrawal et al. | 326/40 |
| 5,594,367 A | 1/1997 | Trimberger et al. | 326/41 |
| 5,594,690 A | 1/1997 | Rothenberger et al. | 365/189.01 |
| 5,598,108 A * | 1/1997 | Pedersen | 326/41 |
| 5,600,263 A | 2/1997 | Trimberger et al. | 326/39 |
| 5,600,264 A | 2/1997 | Duong et al. | 326/39 |
| 5,600,267 A | 2/1997 | Wong et al. | 326/73 |
| 5,600,597 A | 2/1997 | Kean et al. | 365/189.08 |
| 5,625,301 A * | 4/1997 | Plants et al. | 326/41 |
| 5,631,577 A | 5/1997 | Freidin et al. | 326/40 |
| 5,633,830 A | 5/1997 | Sung et al. | 365/221 |
| 5,635,851 A | 6/1997 | Tavana | 326/27 |
| 5,640,106 A | 6/1997 | Erickson et al. | 326/38 |
| 5,640,308 A | 6/1997 | Osann, Jr. et al. | 361/777 |
| 5,642,058 A | 6/1997 | Trimberger et al. | 326/41 |
| 5,642,262 A | 6/1997 | Terrill et al. | 361/783 |
| 5,644,496 A | 7/1997 | Agrawal et al. | 364/489 |
| 5,646,544 A | 7/1997 | Iadanza | 326/38 |
| 5,650,734 A | 7/1997 | Chu et al. | 326/38 |
| 5,652,529 A | 7/1997 | Gould et al. | 326/93 |
| 5,652,904 A | 7/1997 | Trimberger | 395/800 |
| 5,654,564 A | 8/1997 | Mohsen | 257/209 |
| 5,654,649 A | 8/1997 | Chua | 326/38 |

| | | | |
|---|---|---|---|
| 5,661,409 A | 8/1997 | Mohsen | 324/765 |
| 5,661,685 A | 8/1997 | Lee et al. | 365/185.22 |
| 5,671,234 A | 9/1997 | Philips et al. | 371/22.3 |
| 5,671,432 A | 9/1997 | Bertolet et al. | 395/800 |
| 5,680,061 A | 10/1997 | Veenstra et al. | 326/38 |
| 5,682,106 A | 10/1997 | Cox et al. | 326/39 |
| 5,744,979 A | 4/1998 | Goetting | 326/39 |
| 5,744,980 A | 4/1998 | McGowan et al. | 326/40 |
| 5,744,981 A | 4/1998 | Sasaki et al. | 326/48 |
| 5,748,009 A | 5/1998 | Bertolet et al. | 326/39 |
| 5,751,162 A | 5/1998 | Mehendale et al. | 326/37 |
| 5,760,607 A | 6/1998 | Leeds et al. | 326/38 |
| 5,821,776 A * | 10/1998 | McGowan | 326/41 |
| 5,959,466 A * | 9/1999 | McGowan | 326/39 |

FOREIGN PATENT DOCUMENTS

| | | |
|---|---|---|
| EP | 0 358 501 | 3/1990 |
| EP | 0 394 575 | 10/1990 |
| EP | 0 415 542 | 3/1991 |
| EP | 0 583 872 | 2/1994 |
| EP | 0 584 910 | 3/1994 |
| EP | 0 584 911 | 3/1994 |
| EP | 0 585 119 | 3/1994 |
| EP | 0 592 111 | 4/1994 |
| EP | 0 612 154 | 8/1994 |
| EP | 0 617 513 | 9/1994 |
| EP | 0 639 816 | 2/1995 |
| EP | 0 678 985 | 10/1995 |
| EP | 0 499 383 | 12/1996 |
| EP | 0 746 106 | 12/1996 |
| EP | 0 748 051 | 12/1996 |
| EP | 0 756 383 | 1/1997 |
| EP | 0 759 662 | 2/1997 |
| EP | 0 780 846 | 6/1997 |
| EP | 0 785 630 | 7/1997 |
| EP | 0 786 871 | 7/1997 |
| EP | 0 790 706 | 8/1997 |
| EP | 0 896 836 A2 | 11/1997 |
| EP | 0 818 891 A2 | 1/1998 |
| GB | 2 045 488 | 10/1980 |
| JP | 60-059599 | 5/1985 |
| JP | 03-183154 | 9/1991 |
| JP | 062 757 18 | 9/1994 |
| JP | 06-209045 | 10/1994 |
| JP | 07-170038 | 7/1995 |
| JP | 07-211820 | 8/1995 |
| JP | 07-297291 | 11/1995 |
| JP | 08-051536 | 2/1996 |
| WO | 85/01390 | 3/1985 |
| WO | 85/03805 | 8/1985 |
| WO | 93/06559 | 4/1993 |
| WO | 94/10754 | 5/1994 |
| WO | 94/23500 | 10/1994 |
| WO | 95/04404 | 2/1995 |
| WO | WO 95/16993 | 6/1995 |
| WO | 85/03804 | 8/1995 |
| WO | WO 96/20534 | 7/1996 |
| WO | WO 96/31950 | 10/1996 |
| WO | 96/35263 | 11/1996 |
| WO | WO 96/37047 | 11/1996 |
| WO | 97/03444 | 1/1997 |

OTHER PUBLICATIONS

Brown, Chappell, "Data–flow Architecture Runs on FPGA", Nov. 4, 1996, EE Times, Issue 926, pp. 41–42.

Bursky Dave, "Programmable Arrays Mix FPGA and ASIC Blocks", Oct. 14, 1996, Electronic Design, pp. 69–74.

Cypress,, "Getting to Grips with FPGAs", August 1996, Australian Electronics Engineering, pp. 46, 48.

Fawcett et al., "Reconfigurable Processing with Field Programmable Gate Arrays", 1996 IEEE, International Conference on Application–Specific Systems, Architectures and Processors, pp. 293–302.

Ristelhueber, Robert, "A Marriage of Convenience—Integration of PLDs and ASICs promises big gains, risks for chip vendors", January 1997, Electronic Business Today, pp. 63–64.

Tchoumatchenko, et al., "FPGA Design Migration: Some Ramarks", Sep. 23–25, 1996, 6th International Workshop on Field–Programmable Logic and Applications, FPL '96, Darmstadt, Germany, Proceedings, pp. 405–409.

Wilson, Ron, "Actel Unveils FPGA Family", Oct. 28, 1996, Electronic Engineering Times, Issue 925, pp. 88, 92.

Won, Martin S.,et al., "Building FIR Filters in Programmable Logic", August 1996, Embedded Systems Programming, pp. 48–50, 52, 54, 56, 58–59.

Actel, "A 10M20A Mask Programmed Gate Array", January, 1992, pp. 1–195 to 1–223.

Actel, "Array Architecture for ATG with 100% Fault Coverage", January, 1992, pp. 1–225 to 1–235.

Altera, "Altera Targets High–End ASIC Designs with FLEX 10K Architecture", Mar. 20, 1995.

Bogdan, "An Electrically Programmable Silicon Circuit Board", pp. 472–476.

Carmel, U.S. Patent Application, SN 06/754,653, now abandoned, filed Jul. 15, 1985.

Computer Design, Embedded Programmable Architecture Targets Mainstream ASIC Designers, April 1995, pp. 80, 96.

El–Ayat, "A CMOS Electrically Configurable Gate Array", June, 1989, IEEE Journal of Solid–State Circuits, vol. 24, No. 3, pp. 752–761.

El–Gamal, "An Architecture for Electrically Configurable Gate Arrays", April, 1989, IEEE Journal of Solid–State Circuits, vol. 24, No. 2, pp. 394–398.

Gray, "Configurable Hardware: A New Paradigm for Computation", pp. 279–295.

Haines, "Field–Programmable Gate Array with Non–Volatile Configuration", June, 1989, Butterworth & Co. (Publishers) Ltd., vol. 13, No. 5, pp. 305–312.

Hamilton, "Design Issues from FPGA and PLD Architectural Differences", March 1992, Electronic Engineering, No. 783.

Hartmann, "EPROM–Based Logic Chip Opens Its Gates To All Flip–Flop Types, Clocks", Electronic Design, Jul. 11, 1985, pp. 109–188.

Hedlund, "Systolic Architectures–A Wafer Scale Approach", 1984, IEEE, pp. 604–610.

Hedlund, "WASP–A Wafer–Scale Systolic Processor", 1985, IEEE Intl. Conf. on Computer Design, pp. 665–671.

Hsia "Adaptive Wafer Scale Integration", 1980, Japanese Journal of Applied Physics, vol. 19, Supp. 19–1, pp. 193–202.

Jigour, "PEEL Array Architectures Increase Logic Density, Flexibility and Performance", November, 1990, Wescon Conference Record, vol. 34, pp. 316–321.

Johnson, "Silicon Interconnect Technology", 1987, Conference Record, Los Angeles, pp. 1–7.

Kawana, "An Efficient Logic Block Interconnect Architecture for User–Reprogrammable Gate Array", 1990, IEEE, Custom Integrated Circuits Conference, pp. 31.3.1–31.3.4.

National Semiconductor, "Programmable Logic Devices Databook and Design Guide", 1990.

Patil, "A Programmable Logic Approach for VLSI", Sept. 1979, IEEE Transactions on Computers, vol. C–28, No. 9, pp. 594–601.

Skokan, "Programmable Logic Machine (A Programmable Cell Array)", Oct. 1983, IEEE JSSC, vol. SC–18, No. 5, pp. 572–578.

Smith, "Intel's FLEXlogic FPGA Architecture", 1993, IEEE, pp. 378–384.

Snyder, "Intro. to the Configurable, Highly Parallel Computer", No. 1980, Revised, May, 1981.

Snyder, "The Role of the ChiP Computer in Signal Processing", pp. 170–177.

Trimberger, "Field–Programmable Gate Arrays", September 1992, IEEE Design & Test of Computers, No. 3, pp. 3–5.

Vij, "Eliminating Routing Bottlenecks in High Density programmable Architectures", Nov. 1992, Wescon Conference Record, pp. 107–110.

Wahlstrom, "An 11000–Fuse Electrically Erasable Programmable Logic Device (EEPLD) with an Extended Macrocell", August, 1988, IEEE, JSSC, vol. 23, No. 4, pp. 916–922.

Wilson, "Altera Puts Memory Into It's Flex PLDs", E.E. Times.

Wilton, "Architecture of Centralized Field–Configurable Memory", pp. 97–103.

Wong, "A 5000–Gate CMOS EPLD with Multiple Logic. . .", 1989, IEEE, CICC, pp. 5.8.1–5.8.4.

* cited by examiner

FIELD PROGRAMMABLE GATE ARRAY WITH MASK PROGRAMMED INPUT AND OUTPUT BUFFERS

CROSS-REFERENCE TO RELATED APPLICATION

The present application is a continuation of U.S. patent application Ser. No. 08/792,482, now U.S. Pat. No. 5,959,466, entitled "Field Programmable Gate Array with Mask Programmed Input and Output Buffers", filed on Jan. 31, 1997 and issued on Sep. 28, 1999.

BACKGROUND OF THE INVENTION

1. Field of the Invention

The present invention relates to input and output buffers in an integrated circuit. More particularly, the present invention relates an integrated circuit having a field programmable gate array (FPGA) portion and a mask programmable portion, wherein the mask programmable portion provides specialized input and output buffer functions to the integrated circuit.

2. The Prior Art

In an integrated circuit die, signals are transferred into and out of the die by input and output buffers, respectively, configured as part of the integrated circuit within the die. The input and output buffers generally perform relatively standard functions that are useful on all inputs and outputs, however, any or all the input and output buffers may also be configured to perform a variety of specialized functions including voltage gain, current gain, level translation, delay, signal isolation or hysteresis.

As is well known in the art, an FPGA is a collection of groups of gates partitioned into logic function modules which may be configured by user programmable interconnect elements to implement a large variety of digital logic functions. A programmable interconnect architecture, comprising a plurality of initially uncommitted interconnect conductors is superimposed over the array of logic function modules to enable custom connections to be made among the input and outputs of individual ones of logic function modules by user programmable elements to form digital circuits. The user programmable interconnect elements in both the logic function modules and the interconnect architecture may take several forms, such as one time programmable antifuse elements, transistors, RAM cells, etc. These forms of user programmable interconnect elements are well known to those of ordinary skill in the art.

Examples of several aspects of antifuse based FPGA architectures are disclosed in U.S. Pat. No. 4,758,745 to El Gamal, et al., U.S. Pat. No. 4,873,459 to El Gamal, et al., U.S. Pat. No. 5,073,729 to Greene, et al., U.S. Pat. No. 5,083,083 to El Ayat, et al., and U.S. Pat. No. 5,132,571 to McCollum, et al., U.S. Pat. No. 5,172,014 to El Ayat, U.S. Pat. No. 5,187,393 to El Ayat, et al., U.S. Pat. No. 5,191,241 to McCollum, et al., U.S. Pat. No. 5,317,698 to Chan, et al., U.S. Pat. No. 5,367,208 to El Ayat, et al., U.S. Pat. No. 5,451,887 to El Ayat, et al., U.S. Pat. No. 5,477,165 to El Ayat, et al., U.S. Pat. No. 5,509,128 to Chan, et al., U.S. Pat. No. 5,510,730 to El Gamal, et al., U.S. Pat. No. 5,537,056 to McCollum, U.S. Pat. No. 5,570,041 to El Ayat, et al., Ser. No. 08/522,945 to El Ayat, et al., and Ser. No. 08/575,519, El Gamal, et al., assigned to the same assignee as the present invention, and expressly incorporated herein by reference.

An example of a transistor-interconnect-element based FPGA architecture is disclosed in U.S. Pat. No. 4,870,302 to Freeman. Products embodying this type of architecture are marketed by Xilinx, Inc. of San Jose, Calif. In this architecture, transistors controlled by RAM cells are selectively turned on to make interconnections between logic function modules. Another such example is found in U.S. Pat. No. 5,187,393 El Gamal, et al. which uses EPROM or EEPROM transistors.

In a conventional FPGA, logic function modules typically on the periphery of the array are configured to provide the input and output buffers having any or all of the functions recited above. The input and output buffers are connectable to the inputs and the outputs of the logic function modules via the programmable interconnect structure to allow signals to flow into and out of the programmed logic modules comprising the digital circuits of the FPGA for processing by these digital circuits.

The logic function modules may be any one of a variety of circuits, including, for example, the logic modules disclosed in U.S. Pat. No. 4,758,745 to El Gamal, et al., U.S. Pat. No. 4,873,459 to El Gamal, et al., U.S. Pat. No. 4,910,417 to El Gamal, et al., U.S. Pat. No. 5,015,885 to El Gamal, et al., U.S. Pat. No. 5,451,887 to El Ayat, et al., and U.S. Pat. No. 5,477,165 to El Ayat, et al., U.S. Pat. No. 5,055,718 to Galbraith, et al., U.S. Pat. No. 5,198,705 to Galbraith, et al., U.S. Pat. No. 5,440,245, to Galbraith, et al., U.S. Pat. No. 5,448,185 to Kaptanoglu, U.S. Pat. No. 5,479,113 to El Gamal, et al., U.S. Pat. No. 5,570,041 to El Ayat, et al., Ser. No. 08/505,820 to Galbraith, et al., and Ser. No. 08/522,945 to El Ayat, et al., now U.S. Pat. No. 5,606,206, assigned to the same assignee as the present invention, and expressly incorporated herein by reference.

Though it may be highly desirable, and even feasible, to provide each of the input and output buffers of an FPGA with a multitude of functional capabilities, significant resources of the FPGA must be consumed to provide the input and output buffers with the desired multitude of functions. Some of these resources are required to select and program the interconnect elements of the interconnect architecture and the logic modules being used to provide the desired functions of each input and output buffer. Generally, as the functional capability of each input and output buffer increases, so does the amount of programming and selection circuitry needed to program the interconnect elements in the logic function modules. Other of these resources are used by the logic function modules themselves.

Further, when a variety of input or output functions is provided at each pin of the integrated circuit die, the logic function modules which are provided to implement functions which are not selected for a particular input or output pin add additional capacitance and resistive delay. To avoid the additional capacitance and resistive delay associated with the logic function modules of non-selected input and output buffer functions, design choices have been made in the prior art wherein only a selected number of input and output buffer functions are provided to the inputs and outputs of the integrated circuit die.

This solution, however, to the problems of additional capacitance and resistive delay simply raises a new set of problems. The selection of a limited number of input and output buffer functions places constraints on the place and route algorithms used to implement the desired digital circuitry from the logic modules. As is well known in the art, optimizing the use of the available logic function modules in an FPGA, is a very important goal of FPGA circuit designers. The development of placement and route routines which will optimize the use of the logic modules in the FPGA is an expensive and time consuming process. Placing constraints on the functions which may be provided by the input and output buffers may not only substantially affect the utilization of the logic function modules, but, in a worst case, may keep the placement and routing algorithms from implementing the desired digital logic.

Finally, there are some input and output buffer functions that are desired, but cannot feasibly be implemented by logic function modules in an FPGA. An example of such an input buffer function input, includes an input buffer having analog inputs. An example of such an output buffer includes an output buffer that can be connected to a voltage substantially above $V_{cc}$.

It is, therefore, an object of the present invention to optimize the functional capability of the input and output buffers of the integrated circuit die minimizing the amount of program and selection circuitry needed to implement the input and output buffer circuitry.

It is another object of the present invention to optimize the functional capability of the input and output buffers of the integrated circuit die while minimizing the capacitance and resistive delay associated with the input and output buffer circuits.

It is yet another object of the present invention to provide input and output buffers to an FPGA with greater functional capability than can be feasibly implemented by logic function modules in the FPGA.

It is a further object of the present invention to provide input buffers to an FPGA having analog inputs.

It is another object of the present invention to provide output buffers of an FPGA connectable to a voltage substantially greater than $V_{cc}$.

It is a further object of the present invention to provide output buffers for an FPGA which inject less noise into the FPGA.

It is another object of the present invention to provide output buffers for an FPGA which have low power consumption.

BRIEF DESCRIPTION OF THE INVENTION

According to the present invention, a mask programmed portion of an integrated circuit provides some of the input and output buffer functions to an FPGA portion of the integrated circuit to provide additional functional capability to the I/O buffers, and improves the flexibility, signal isolation, speed and power management of the FPGA architecture. In CMOS technology, the mask programmed portion comprises N-channel and P-channel MOS transistors that can be connected together to implement almost any type of I/O buffer function conceivable in CMOS technology.

According to the present invention, an integrated circuit die is partitioned into an FPGA portion and a mask programmable portion. In the FPGA portion, logic modules are connected to an interconnect structure comprising interconnect conductors.

In one aspect of the invention standard FPGA input buffers including for example level translation and power down, and a standard FPGA output buffer including a large drive and tri-state capability are disposed in the FPGA portion of the integrated circuit. It should be appreciated, however, that the functions implemented in the standard input and output buffers will depend upon the input and output functions required by the FPGA and the input and output functions provided by the mask programmable portion of the integrated circuit.

In another aspect of the present invention, disposed in the mask programmable portion of the integrated circuit are an input and output buffers having any of a number of specialized input functions. In the integrated circuit, interconnect conductors span both the FPGA portion and the masked programmed portion to connect the FPGA portion to the input and output buffers disposed in the mask programmed portion. In the FPGA portion, the interconnect conductors form intersections with the interconnect architecture formed by the interconnect conductors in the FPGA portion of the integrated circuit. Disposed at a number of these intersections are user programmable interconnect elements, such as a one time programmable antifuse element, transistors, RAM cells, etc. The use of programmable interconnect elements are employed to selectively connect the interconnect conductors to the interconnect architecture of the FPGA portion.

According to another aspect of the present invention, in the mask programmable portion, the input and/or output buffers of the mask programmable portion may either be connected to shared Vcc and ground power busses and/or be segregated to certain Vcc and ground power bus portions that are isolated from one another. Further, dedicated Vcc and ground power pads for certain I/O locations may provide selected input and/or output buffers separate busses to I/O pins.

It should be appreciated that the I/O buffer function circuits to be described herein may be provided to a single I/O pin or several I/O pins in the masked programmed portion of the integrated circuit, and the choice of the I/O buffers circuits to be included in the mask programmed portion will depend upon the I/O needs of the end user of the circuit. Accordingly, in the present inventions a variety of integrated circuits, each having a different mask programmed portion and the same general FPGA portion, are contemplated.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, a mask programmed (i.e., dedicated) portion of an integrated circuit provides some of the input and output (I/O) buffer functions to an FPGA portion of the integrated circuit. Conventionally all the I/O buffer functions of an FPGA are provided by I/O buffers configured by inputs from the logic modules of the FPGA. Mask programming some of the I/O buffer functions in an FPGA provides additional functional capability to the I/O buffers. In CMOS technology, the mask programmed portion comprises N-channel and P-channel MOS transistors that can be connected together to implement almost any type of I/O buffer function conceivable in CMOS technology. It should be appreciated that technologies other than CMOS are available for implementing the masked programmed portion of the present invention.

In addition to increasing the availability of specialized I/O buffer functions, the removal of specialized I/O buffer functions from the FPGA portion of the integrated circuit improves the flexibility, signal isolation, speed and power management of the FPGA architecture. Further, logic modules in the FPGA which would have been used to implement specialized I/O buffer functions can be used more efficiently to increase the performance of the FPGA.

It should be appreciated that the I/O buffer function circuits to be described herein may be provided to a single I/O pin or several I/O pins in the masked programmed portion of the integrated circuit. The choice of the I/O buffers circuits to be included in the mask programmed portion will depend upon the I/O needs of the end user of the circuit. Accordingly, a variety of integrated circuits, each having a different mask programmed portion and the same general FPGA portion, are contemplated by the present invention.

Figure 1:
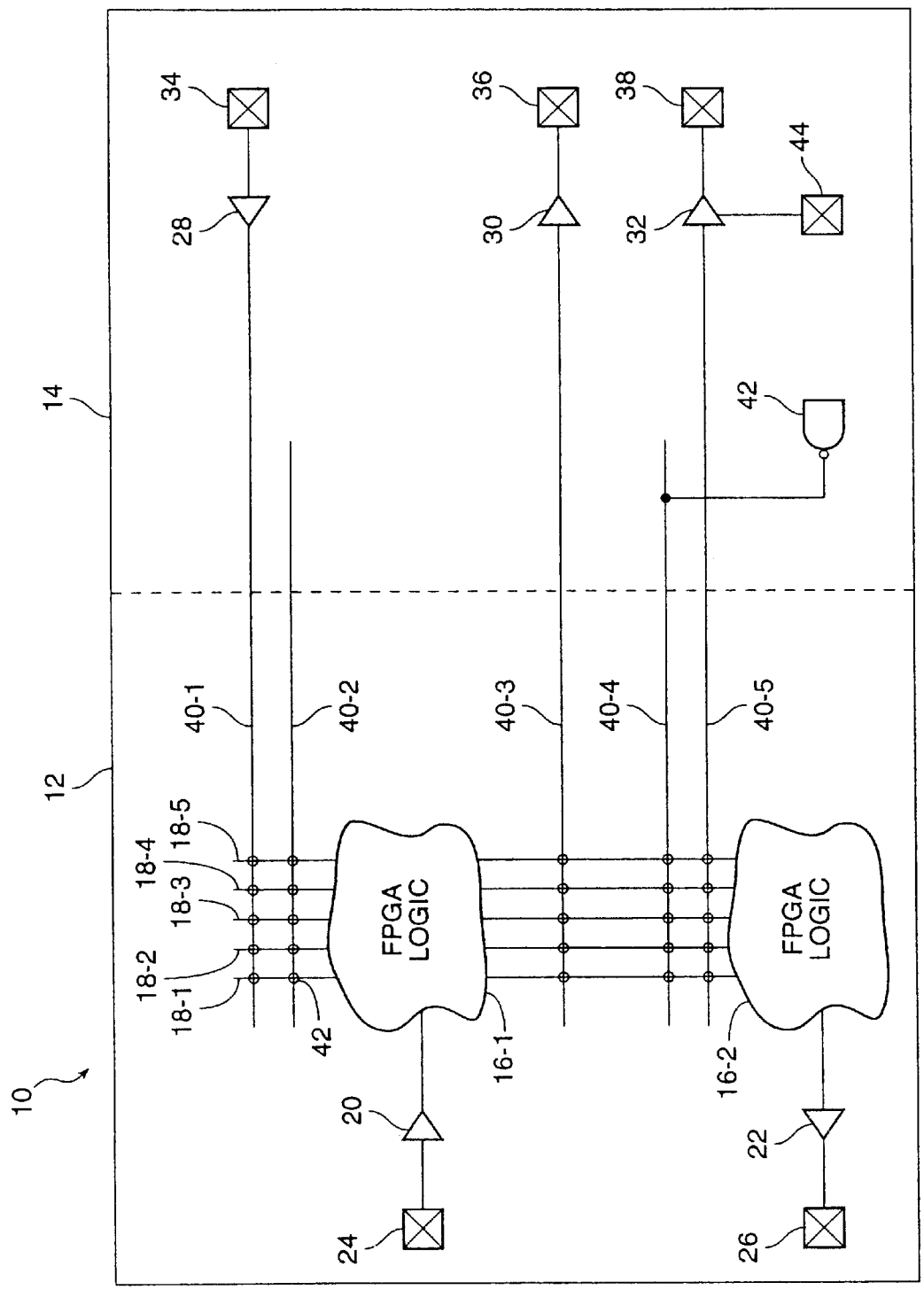
FIG. 1 is block diagram of an integrated circuit having an FPGA portion and a mask programmed portion according to the present invention.

Turning now to FIG. 1, a block diagram depicts the hybrid FPGA and mask programmable architecture according to the present invention. In FIG. 1, an integrated circuit die 10 is partitioned into an FPGA portion 12 and a mask programmable portion 14. It should be appreciated, however, that the present invention is not limited by the particular physical layout of the partitioning of the FPGA portion 12 and the mask programmable portion 14 shown in the integrated circuit 10. In the FPGA portion 12, exemplary logic modules 16-1 and 16-2 are connected to an interconnect structure comprising interconnect conductors 18-1 through 18-5.

The interconnect conductors 18-1 through 18-5 represent a wide variety of interconnection schemes for connecting logic modules in an FPGA. The present invention is not limited to any specific interconnect architecture employed in FPGA. To avoid overcomplicating the disclosure and obscuring the present invention, the various interconnection schemes available for interconnecting logic modules and FPGA will not be disclosed herein. Numerous examples of interconnection schemes which are suitable for use in conjunction with the present invention are well known to those of ordinary skill in the art. Different interconnect architectures including segmented interconnect architectures are well known to those of ordinary in the art, and a non-exhaustive list of such interconnect schemes is represented by the interconnect schemes referred to the above discussed prior art section.

Further, there are numerous known logic function module designs which are available to be employed in the present invention period. The present invention is not limited to any specific logic module design employed in FPGA. To avoid overcomplicating the disclosure and obscuring the present invention, the various logic function module designs available for use in a FPGA will not be disclosed herein. A non-exhaustive list of such logic modules is represented by the logic modules referred to the above discussed prior art section. Those of ordinary skill in the art will appreciate the particular logic module selected for an actual realization of the present invention will be largely a matter of design choice.

Disposed in the FPGA portion 12 is a standard FPGA input buffer 20 typically including level translation and power down, but no other functionality, and an output buffer 22 typically implementing a large drive and tri-state capability, but no other functionality. The input of input buffer 20 is connected to an I/O pin 24, and the output of the input buffer 20 is connected to exemplary FPGA logic module 16-1. The output of the output buffer 22 is connected to an I/O pin 26, and the input to the output buffer 22 is connected to exemplary logic function module 16-2. The functions implemented in the standard input and output buffers 20 and 22 will depend upon the input and output functions required by the FPGA and the input and output functions provided by the mask programmable portion 14 of the integrated circuit 10.

Disposed in the mask programmable portion 14 of the integrated circuit 10, is an input buffer 28 which represents any of a number of specialized input functions. Output buffers 30 and 32 having specialized output functions are also shown disposed in the mask programmable portion 14. The input of input buffer 28, the output of output buffer 30, and the output of output buffer 32 are connected to I/O pins 34, 36 and 38, respectively. Descriptions of specific input and output buffer circuits suitable for use in the mask programmable portion 14 will be made herein.

In the integrated circuit 10, interconnect conductors 40-1 through 40-5 span both the FPGA portion 12 and the masked programmed portion 14. Interconnect conductors 40-1, 40-3, and 40-5 are employed to connect the FPGA portion 12 to the input and output buffers, 28, and 30 and 32, respectively, disposed in the mask programmed portion 14. In the FPGA portion 12, the interconnect conductors 40-1 through 40-5 form intersections with the interconnect architecture represented by interconnect conductors 18-1 through 18-5.

Disposed at a number of these intersections are user programmable interconnect elements, one of which is shown with an exemplary reference numeral 42, that may take several forms, such as a one time programmable antifuse element, transistors, RAM cells, etc. These forms of user programmable interconnect elements are known to those of ordinary skill in the art. The use of programmable interconnect elements depicted as circles at the intersections of the interconnect conductors 40-1 through 40-5 and the interconnect architecture in the FPGA portion 12 are employed to selectively connect the interconnect conductors 40-1 through 40-5 to the interconnect architecture of the FPGA portion.

In the mask programmable portion 14, interconnection between the interconnect conductors 40-1 through 40-5 and the inputs and outputs of the input and output buffers 28, and 30 and 32, respectively, are made as mask programmable connections. The interconnect conductors 40-1 through 40-5 may also, however, be connected to other logic elements in the mask programmable portion 14 of the integrated circuit 10, as shown by the connection of interconnect conductor 40-4 to the output of NAND gate 42. Further, interconnect conductor 40-5 is shown as a dedicated interconnect conductor connected to the input of output buffer 32. It should be appreciated, that any of a number of schemes for connecting the FPGA portion 12 to the mask programmable portion 14 may be implemented that are consistent with the present invention.

Figure 2A:
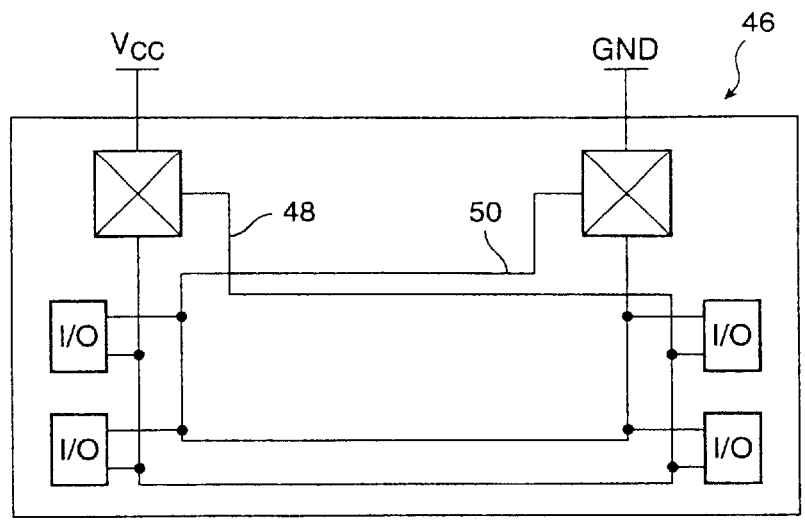
FIG. 2A illustrates an FPGA with input and output buffers connected to common set of power busses according to the prior art.

A dedicated ground pin 44 connected to output buffer 32 in the mask programmable portion 14, illustrates one of the advantages associated with the present invention, namely, isolation of an input or output buffer from global common ground and power buses. As illustrated in FIG. 2A, in an FPGA 46 all input and output buffers share a common set of Vcc and ground power buses 48 and 50.

Figure 2B:
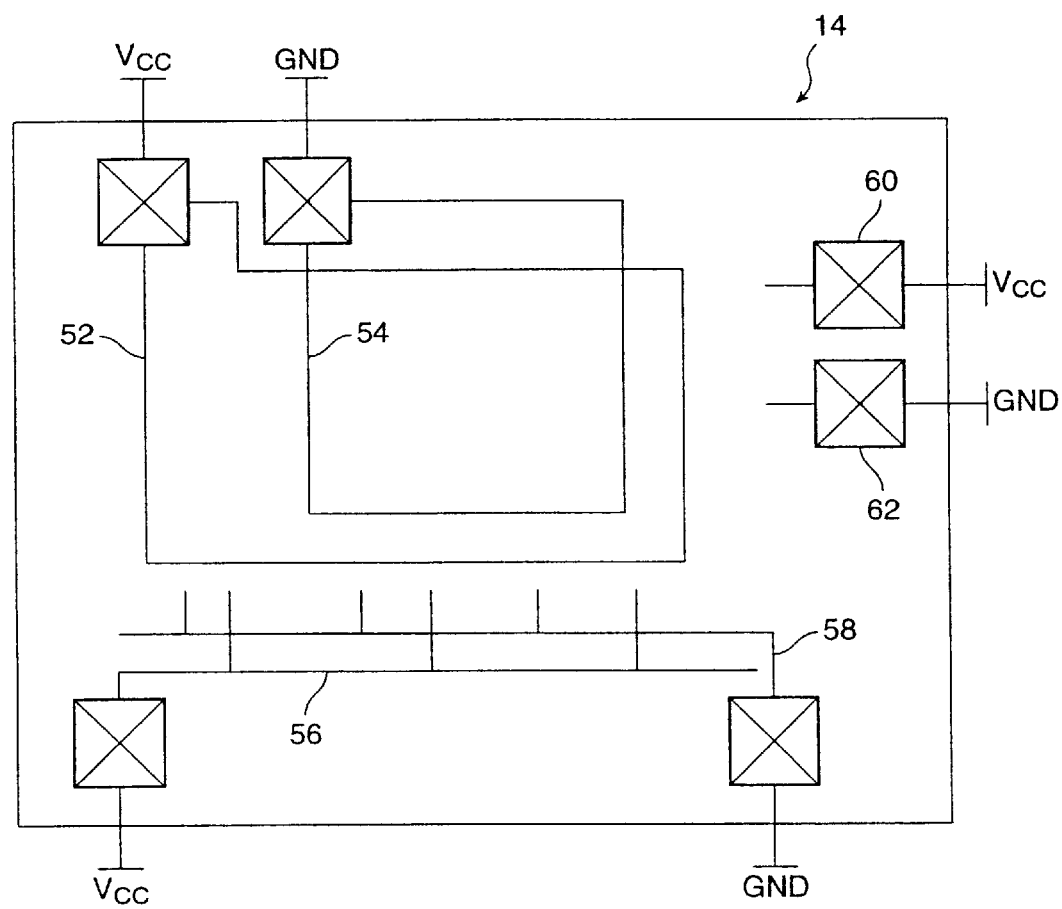
FIG. 2B illustrates input and output buffers connected to dedicated power buses in a mask programmable portion of an integrated circuit according to the present invention.

In contrast, as illustrated in FIG. 2B, the input and/or output buffers of the mask programmable portion 14 of the present invention can either be connected to shared Vcc and ground power busses 52 and 54 and/or be segregated to certain Vcc and ground power bus portions 56 and 58. Further, the mask programmed portion 14 can be used to substitute dedicated Vcc and ground power pads 60 and 62 for certain I/O locations, and thereby provide selected input and/or output buffers separate busses to I/O pins. Such an arrangement keeps the switching noise of a very high speed or high drive output from affecting other circuitry. It can also be used to isolate a very noise sensitive input from the switching noise of other circuits.

It should be appreciated that to avoid unnecessary duplication of reference numerals, elements in figures which correspond to the same elements in other figures may given the same reference numeral in both figures.

Figure 3A:
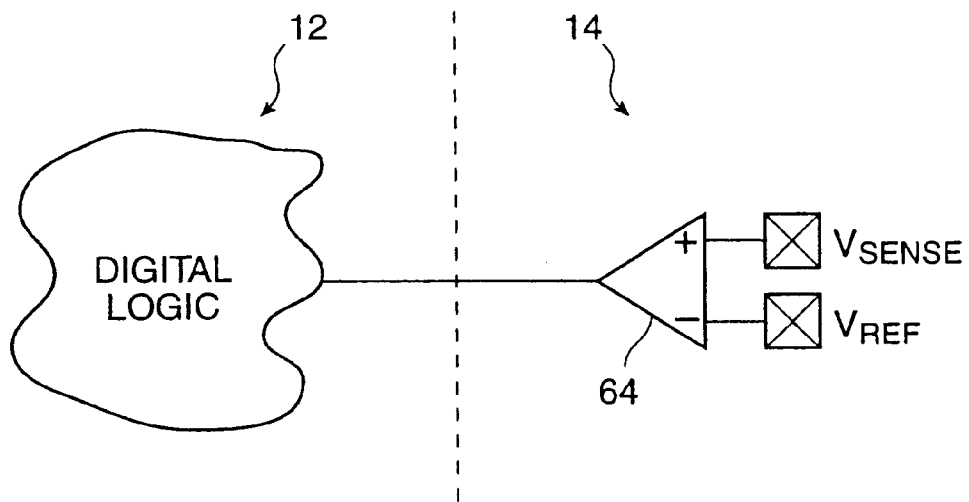
FIG. 3A is an input buffer implemented as a comparator in a mask programmable portion of an integrated circuit according to the present invention.
Figure 3B:
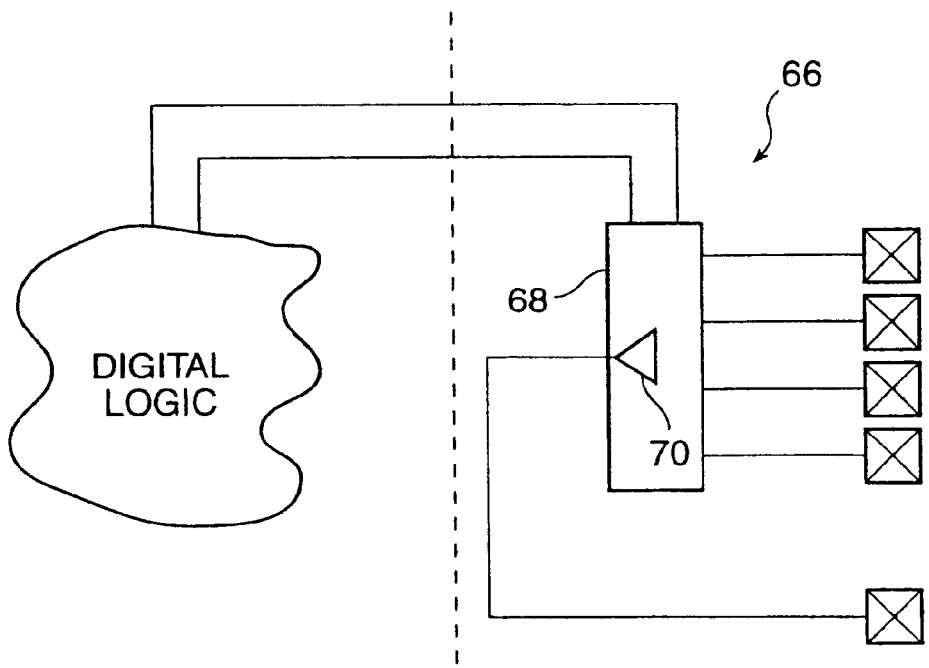
FIG. 3B is an input buffer implemented with a multiplexing function in a mask programmable portion of an integrated circuit according to the present invention.

As illustrated in FIGS. 3a and 3b, the input and output buffers in the mask programmable portion can be configured to respond to analog input signals. In FIG. 3A, an input buffer 64 in the mask programmable portion 14 is implemented as a comparator. The inputs to the input buffer 64 are first and second analog input voltage, namely, $V_{sense}$ and $V_{ref}$. The output of input buffer 64 is a digital output that is supplied to the FPGA portion 12 of the integrated circuit 10.

In FIG. 3B, an input buffer 66 having a multiplexer function is implemented in the mask programmable portion 14 with a multiplexer 68 and an amplifier 70. The inputs to the input buffer 66 are a plurality of four analog input voltages. First and second select signals $S_0$ and $S_1$ are provided to the multiplexer 68 by the FPGA portion. The analog output of the multiplexer 68 is fed through an amplifier 70 to form the input buffer 66 output shown as being output off of the integrated circuit 10. The analog signal may also be fed into an analog circuit (not illustrated) formed in the mask programmable portion 14 of the integrated circuit 10 as disclosed in co-pending application Ser. No. 08/792,902, filed Jan. 31, 1997, (Entitled "A FIELD PROGRAMMABLE GATE ARRAY WITH MASK PROGRAMMED ANALOG FUNCTION CIRCUITS", by inventor John E. McGowan, and filed the same day as this application and expressly incorporated herein by reference.

Figure 4A:
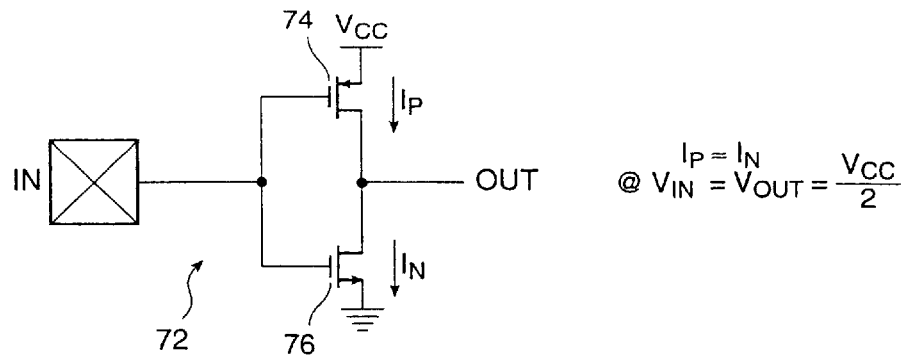
FIG. 4A is an input buffer compatible with 74HC/AC technologies ("CMOS") according to the prior art.

It is known in the art that input pads are connected to circuits of different technologies having different standardized voltage thresholds. It is, therefore, important to have the input buffers to the FPGA be compatible with the standardized threshold levels of different technologies. FIG. 4a illustrates an input buffer 72 wherein the buffer is compatible with 74HC/AC technologies ("CMOS"). The input buffer 72 comprises an inverter structure well known in the art having a P-channel MOS transistor 74 and an N-channel MOS transistor 76. The conductivity of the P-channel MOS transistor 74 is matched to the conductivity of the N-channel MOS transistor 76 such that the threshold voltage of the buffer, that is, the point at which $V_{in}$ is equal to $V_{out}$, is set at $V_{cc}/2$.

Figure 4B:
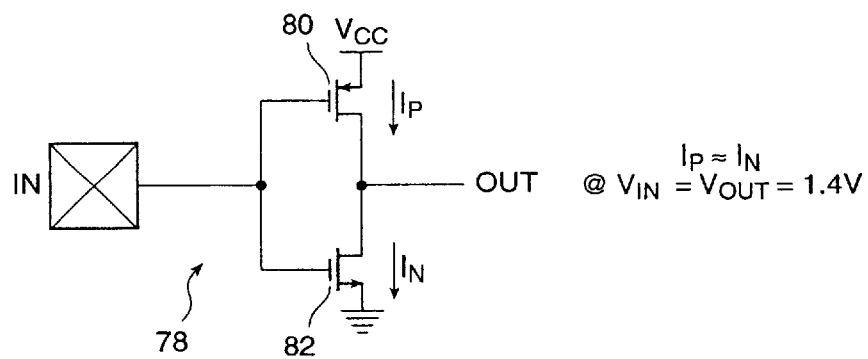
FIG. 4B is an input buffer compatible with 74HCT/ACT/F/AS technologies ("TTL") according to the prior art.

FIG. 4b illustrates an input buffer 78 wherein the buffer is compatible with 74HCT/ACT/F/AS("TTL") technologies. Like input buffer 72, input buffer 78 is an inverter comprising P-channel MOS transistor 80 and N-channel MOS transistor 82 well known in the art to provide input level translation. In input buffer 78, the conductivity of the N-Channel MOS transistor 82 is substantially greater than the conductivity of the P-Channel MOS transistor 80. The conductivity in the N-Channel MOS transistor 82 is greater than conductivity of the P-Channel MOS transistor 82 so that the point in input buffer 78 at which the $V_{in}$ is equal to $V_{out}$ is equal to a voltage of 1.4 volts. This value is obtained as an average of the lower TTL voltage of 0.8 volts and the upper TTL voltage of 2.0 volts.

Figure 4C:
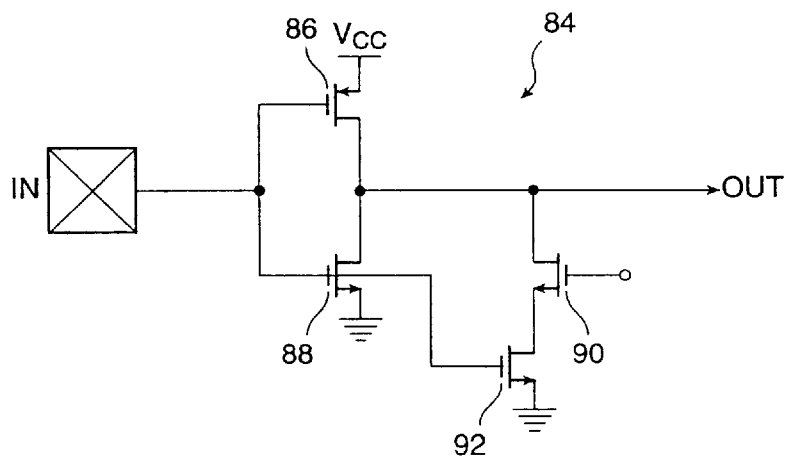
FIG. 4C is an input buffer compatible with either 74HC/AC or 74HCT/ACT/F/AS technologies, ("CMOS") or ("TTL"), implemented in a mask programmable portion or an FPGA portion of an integrated circuit according to the present invention.

FIG. 4C depicts an input buffer 84 which can be programmed with a signal from the FPGA portion 12 of the integrated circuit 10 to respond to either of the input threshold voltages of input buffers 72 and 78. In input buffer 84, a P-Channel MOS transistor 86 and an N-Channel MOS transistor 88 correspond to the P-Channel MOS transistor 74 and the N-Channel MOS transistor 76 of input buffer 72.

To change the input threshold level of input buffer 84 from that of input buffer 72 to the input threshold level of input buffer 78, an N-Channel MOS transistor 90 has its drain connected to the output of the invertor represented by P-Channel MOS transistor 86 and N-Channel MOS transistor 88 and its source connected to the drain of an N-Channel MOS transistor 92 having its source connected to ground. The gate of N-Channel MOS transistor 92 is connected to the input pad along with the gate of N-Channel MOS transistor 88, and the gate of N-Channel MOS transistor 90 is connected to the signal controlled by the programmable element. Alternatively, the gate of N-channel MOS transistor 90 can be mask programmed to be tied to either Vcc or ground.

In this configuration, the N-Channel MOS transistor 90 and the N-Channel MOS transistor 92 adjust the ratio of the conductivities of P-Channel MOS transistor 86 and N-Channel MOS transistor 88 to match the ratio of conductivities of the P-Channel MOS transistor 80 and N-Channel MOS transistor 82 in input buffer 78. It should be appreciated by those of ordinary skill in the art, that input buffer thresholds other than those of input buffers 72 and 78 could be implemented by the input buffer 84. The implementation of other input buffer thresholds is made by placing an appropriate number of pairs of N-Channel MOS transistors in parallel with the N-Channel MOS transistors 90 and 92, respectively, to compensate for the ratio of conductivities of P-Channel and N-Channel MOS transistors 86 and 88.

Figure 5:
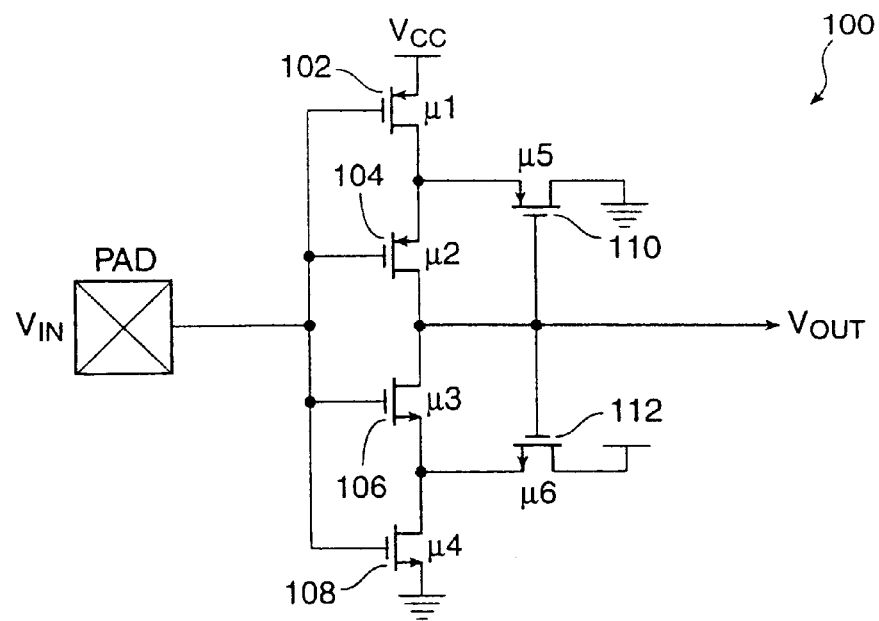
FIG. 5 is an input buffer implemented with a Schmitt trigger function in a mask programmable portion of an integrated circuit according to the present invention.

It is well known in the art that it is sometimes desirable to provide hysteresis in the input buffers to a digital circuit. However, implementing input hysteresis to the digital circuits of a programmed FPGA requires many valuable chip resources. Further, since most inputs to the digital circuits in an FPGA do not require such hysteresis, providing input hysteresis is a substantial speed penalty. In FIG. 5, a Schmitt trigger 100 is shown which may be implemented in the mask programmable portion 14 of the integrated circuit 10 on an as needed basis.

In Schmitt trigger 100, the thresholds for rising edge and falling edge inputs are spread apart to create a deadband. This deadband resists unwanted oscillations caused by noise on very slow input edge rates. The size of the deadband in Schmitt trigger 100 is varied by adjusting the ratio of conductivities between a first set of transistors comprising of P-Channel MOS transistors 102 and 104, and N-Channel MOS transistors 106 and 108, and a second group of transistors comprising N-Channel MOS transistor 110 and P-Channel MOS transistor 112. In varying the size of the deadband of the Schmitt trigger 100, inputs to the mask programmable portion 14 of the integrated circuit can be varied to make the desired choice in the tradeoff between noise immunity and propagation delay.

Using the mask programmable portion 14 to implement the input buffer shown above allows another form of flexibility, that of speed versus power optimization. A standard input buffer will typically be constructed of devices which are large enough to offer good switching speed, yet operate within a particular power (AC or DC) or area budget. A few important signals may require faster speed, which can be produced by an input buffer with larger devices. Likewise, a noise or power sensitive design may desire input buffers with very small sizes (reduced capacitance, reduced totem pole currents, etc.). In this invention, these specialized input buffers can be implemented in the mask programmable portion 14 of the integrated circuit 10, while the standard buffers are implemented in the FPGA portion 12 of the integrated circuit 10.

Figure 6:
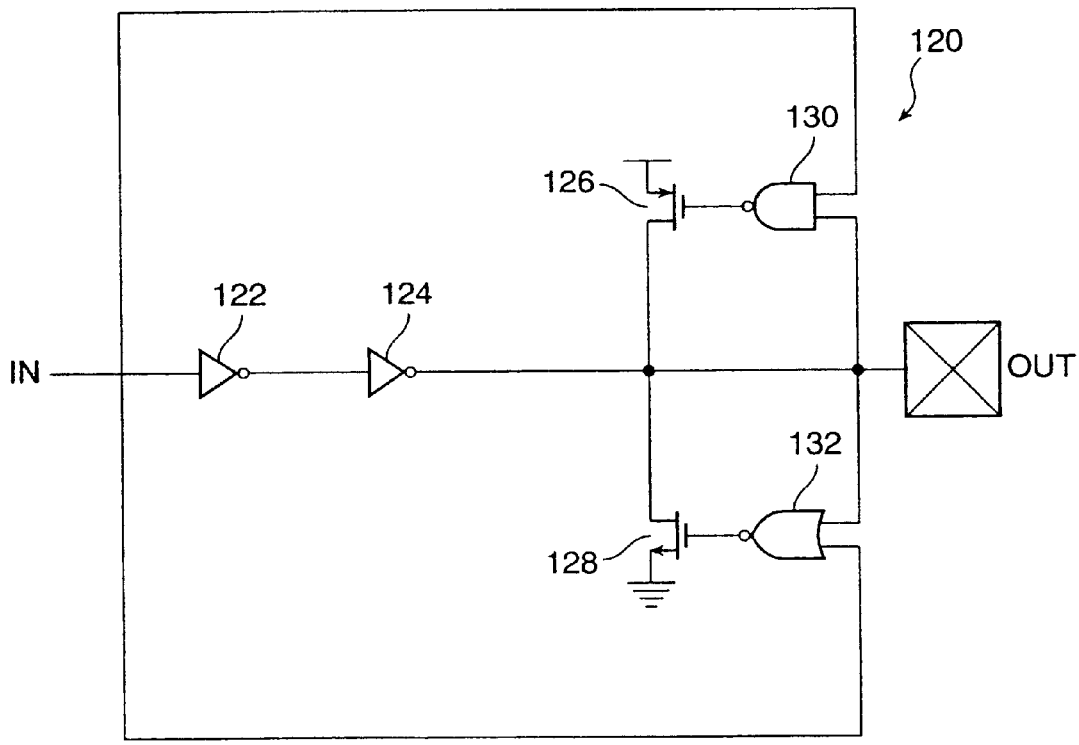
FIG. 6 is an output buffer implemented for low power and noise operation in a mask programmable portion of an integrated circuit according to the present invention.

Speed versus power considerations also apply to output buffer circuits. In an FPGA the output buffer circuits are general purpose output buffer implemented with a good balance between propagation delay and efficiency, wherein efficiency is the ratio of power delivered to the load to total power during a switching cycle. For a power sensitive design, it may be desirable to have more efficient though slower outputs. FIG. 6 illustrates an output buffer 120 for the mask programmable portion 14 of the integrated circuit 10.

Output buffer 120 is a very efficient output buffer having a high DC drive. Switching in output buffer 120 is accomplished by first and second inverters 122 and 124 comprising MOS transistors as is well known in the art. The MOS transistors in first and second inverters 122 and 124 can be made small, and thereby produce limited totem-pole power dissipation. High output drive is provided by P-Channel and N-channel MOS transistors 126 and 128 which are relatively large devices. Power is limited because P-Channel and N-channel MOS transistors 126 and 128 are turned on by NAND gate 130 and NOR gate 132, respectively, only after switching occurs and not both at the same time.

A more common method of saving power is to limit voltage swing at the output pad. When an N-channel MOS transistor is employed as the pull-up device instead of a P-channel MOS transistor, the voltage swing at the output may be reduced by over 1 volt. Since power dissipation is proportional to the square of the output voltage swing, the reduction in power consumption can be substantial. It is advantageous to implement such structures in the mask programmable portion 14, while implementing more general purpose full rail-to-rail swing buffers in the FPGA portion 12. The voltage swing at the output may be further reduced by providing a lower Vcc.

For a speed sensitive design, the speed in the output buffer can be enhanced by mask programming. A common example of this is "clock-to-out" wherein the delay from a clocked flip-flop through an output buffer is critical. When implemented by an FPGA, the speed may be a problem because the flip-flop may not lie adjacent to the output buffer due to layout constraints and/or FPGA output buffers are usually general purpose that can support tri-state and other functions. In the mask programmed portion the flip-flop can be placed adjacent to the output buffer for a more compact layout, and large area fast output buffer with no tri-state capability can be employed.

In an FPGA it is possible to provide output buffers, such as the output buffers disclosed in application Ser. No. 08/673,701, filed Jun. 25, 1996, assigned to the same assignee as the present invention, and expressly incorporated herein by reference, wherein the output voltage may be connected to a mixed voltage levels system. In a circuit design where only a few pins need mixed voltage capabilities (e.g., in a 3.3 volt design where a small number of pins need to interface to 5 volt levels), it may be wasteful to place level shifting capability in each output buffer of the FPGA. The level shifting can be accomplished on an as needed basis in the mask programmed portion 14. This permits the FPGA to have a more generic output buffer with smaller space, lower power, and faster propagation delay.

Figure 7A:
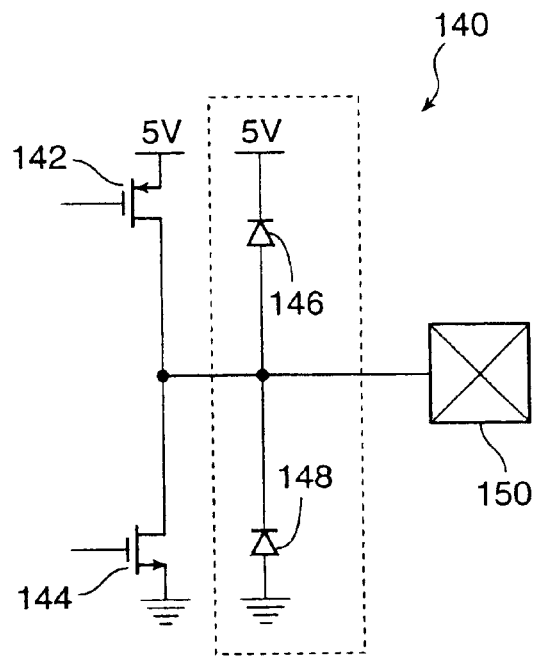
FIG. 7A is an output buffer having a standard output totem pole stage according to the prior art.

Further, by mask programming the output buffer, the integrated circuit 10 may be interfaced to an external voltage greater than $V_{cc}$. The last stage in an FPGA output buffer 140 as illustrated in FIG. 7a is typically an output totem pole stage comprising P-channel and N-channel MOS transistors 142 and 144 having inherent parasitic diodes 146 and 148. The output buffer 140 will typically clamp an output pad 150 at one diode voltage above $V_{cc}$.

Figure 7B:
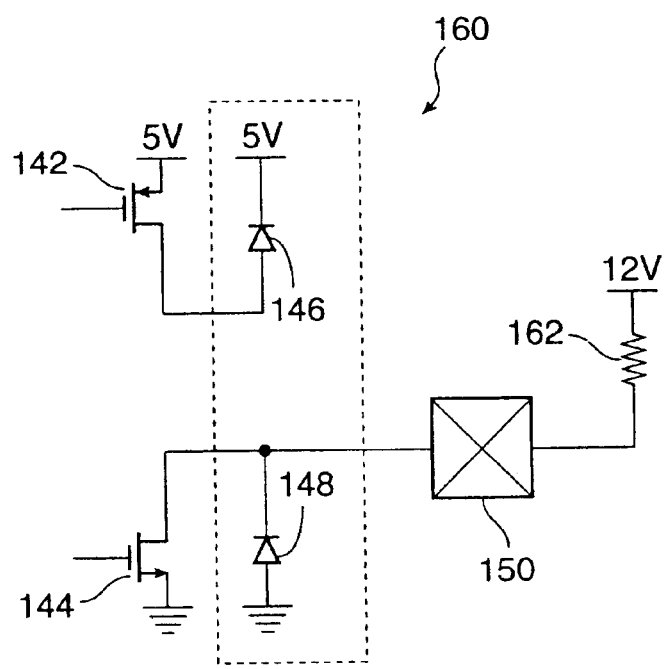
FIG. 7B is an output buffer having a N-channel MOS transistor in an output totem pole stage configured as an open drain structure in a mask programmable portion of an integrated circuit according to the present invention.

In the mask programmed output buffer 160 illustrated in FIG. 7b, N-channel MOS transistor 144 is configured as an open drain structure, and the inherent parasitic diode 146 is open circuited. The output swing is limited to the breakdown voltages of the N-channel (or NPN) devices of the mask programmed portion 14. With an external pull-up resistor 162, it is conceivable that the output buffer 160 could control a 12 volt interface. This is not possible with the generic CMOS output buffer 140.

It will be appreciated by those of ordinary skill in the art that other I/O buffer circuits exist that may be implemented better in the mask programmable portion 14 of the integrated circuit 10 according to the present invention than in the FPGA portion 12 of the integrated circuit 10. Examples include but are not limited to metastable hardened inputs and low-voltage differential signaling input buffers.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A hybrid mask programmable and field programmable integrated circuit architecture comprising:

a plurality of pads;

a plurality of input/output buffers of a mask programmable portion of said integrated architecture;

a first voltage bus connected to a first one of said plurality of said pads at a first potential and to first selected ones of said plurality of input/output buffers;

a second voltage bus connected to a second one of said plurality of said pads at a second potential and to said first selected ones of said plurality of input/output buffers; and a second selected one of said plurality of input/output buffers connected to a third one of said plurality of said pads at said first potential.

2. An integrated circuit architecture as in claim 1 wherein said first potential is Vcc.

3. An integrated circuit architecture as in claim 2 wherein said second potential is ground.

4. An integrated circuit architecture as in claim 1 wherein said first potential is ground.

5. An integrated circuit architecture as in claim 4 wherein said second potential is Vcc.

6. A hybrid mask programmable and field programmable integrated circuit architecture comprising:

a plurality of pads;

a plurality of input/output buffers of a mask programmable portion of said integrated architecture;

a first voltage bus connected to a first one of said plurality of said pads at a first potential and to first selected ones of said plurality of input/output buffers;

a second voltage bus connected to a second one of said plurality of said pads at a second potential and to said first selected ones of said plurality of input/output buffers;

a second selected one of said plurality of input/output buffers connected to a third one of said plurality of said pads at said first potential; and a third selected one of said plurality of input/output buffers connected to a fourth one of said plurality of said pads at said second potential.

7. An integrated circuit architecture as in claim 6 wherein said first potential is Vcc.

8. An integrated circuit architecture as in claim 6 wherein said first potential is ground.

9. An integrated circuit architecture as in claim 7 wherein said second potential is ground.

10. A hybrid dedicated and field programmable integrated circuit architecture comprising:

a dedicated portion comprising:

a plurality of dedicated input buffer circuits, each of said input buffer circuits having at least one input and at least one output; and a first group of input/output pads, at least one of said input/output pads of said first group connected to an input of one of said input buffer circuits; and a field programmable gate array portion comprising:

a plurality of programmable digital logic function modules, each of said digital logic function modules having a plurality of inputs and at least one output;

a second group of input/output pads;

a plurality of interconnect conductors, each of said interconnect conductors divided into one or more segments, at least some first ones of said segments running in a first direction and at least some second ones of said segments running in a second direction different from said first direction to form intersections between said first ones and said second ones of said segments, said interconnect conductors forming intersections with said plurality of inputs and said at least one output of said digital logic function modules, said interconnect conductors forming intersections with said second group of input/output pads, said interconnect conductors forming intersections with said at least one output of one of said input buffer circuits from said dedicated portion; and a plurality of user programmable interconnect elements, first ones of said interconnect elements connected between adjoining ones of said segments in a same one of said interconnect conductors, second ones of said interconnect elements connected between intersections of selected ones said first and second segments, third ones of said interconnect elements connected between inputs and outputs of said digital logic function modules and selected interconnect conductors, fourth ones of said interconnect elements connected between intersections of said second group of input/output pads and selected ones of said interconnect conductors, fifth ones of said interconnect elements connected between intersections with said at least one output of one of said input buffer circuits and selected ones of said interconnect conductors.

11. A hybrid dedicated and field programmable integrated circuit architecture comprising:

a dedicated portion comprising:

a plurality of dedicated output buffer circuits, each of said output buffer circuits having at least one input and at least one output; and a first group of input/output pads, at least one of said input/output pads of said first group connected to an output of one of said output buffer circuits; and a field programmable gate array portion comprising:

a plurality of programmable digital logic function modules, each of said digital logic function modules having a plurality of inputs and at least one output;

a second group of input/output pads;

a plurality of interconnect conductors, each of said interconnect conductors divided into one or more segments, at least some first ones of said segments running in a first direction and at least some second ones of said segments running in a second direction different from said first direction to form intersections between said first ones and said second ones of said segments, said interconnect conductors forming intersections with said plurality of inputs and said at least one output of said digital logic function modules, said interconnect conductors forming intersections with said second group of input/output pads, said interconnect conductors forming intersections with said at least one input of one of said output buffer circuits from said dedicated portion; and a plurality of user programmable interconnect elements, first ones of said interconnect elements connected between adjoining ones of said segments in a same one of said interconnect conductors, second ones of said interconnect elements connected between intersections of selected ones said first and second segments, third ones of said interconnect elements connected between inputs and outputs of said digital logic function modules and selected interconnect conductors, fourth ones of said interconnect elements connected between intersections of said second group of input/output pads and selected ones of said interconnect conductors, fifth ones of said interconnect elements connected between intersections with said at least one input of one of said output buffer circuits and selected ones of said interconnect conductors.

12. A hybrid dedicated and field programmable integrated circuit architecture comprising:

a dedicated portion comprising:

a plurality of dedicated input buffer circuits, each of said input buffer circuits having at least one input and at least one output;

a plurality of dedicated output buffer circuits, each of said output buffer circuits having at least one input and at least one output; and a first group of input/output pads, at least one of said input/output pads of said first group connected to an input of one of said input buffer circuits, at least one of said input/output pads of said first group connected to an output of one of said output buffer circuits; and a field programmable gate array portion comprising:

a plurality of programmable digital logic function modules, each of said digital logic function modules having a plurality of inputs and at least one output;

a second group of input/output pads;

a plurality of interconnect conductors, each of said interconnect conductors divided into one or more segments, at least some first ones of said segments running in a first direction and at least some second ones of said segments running in a second direction different from said first direction to form intersections between said first ones and said second ones of said segments, said interconnect conductors forming intersections with said plurality of inputs and said at least one output of said digital logic function modules, said interconnect conductors forming intersections with said second group of input/output pads, said interconnect conductors forming intersections with said at least one output of one of said input buffer circuits from said dedicated portion, said interconnect conductors forming intersections with said at least one input of one of said output buffer circuits from said dedicated portion; and a plurality of user programmable interconnect elements, first ones of said interconnect elements connected between adjoining ones of said segments in a same one of said interconnect conductors, second ones of said interconnect elements connected between intersections of selected ones said first and second segments, third ones of said interconnect elements connected between inputs and outputs of said digital logic function modules and selected interconnect conductors, fourth ones of said interconnect elements connected between intersections of said second group of input/output pads and selected ones of said interconnect conductors, fifth ones of said interconnect elements connected between intersections with said at least one output of one of said input buffer circuits and selected ones of said interconnect conductors, sixth ones of said interconnect elements connected between intersections with said at least one input of one of said output buffer circuits and selected ones of said interconnect conductors.

13. A hybrid dedicated and field programmable integrated circuit architecture comprising:

a plurality of pads;

a plurality of input/output buffers of a dedicated portion of said integrated architecture;

a first voltage bus connected to a first one of said plurality of said pads at a first potential and to first selected ones of said plurality of input/output buffers;

a second voltage bus connected to a second one of said plurality of said pads at a second potential and to said first selected ones of said plurality of input/output buffers; and a second selected one of said plurality of input/output buffers connected to a third one of said plurality of said pads at said first potential.

14. The integrated circuit architecture of claim 13, wherein said first potential is Vcc.

15. The integrated circuit architecture of claim 14, wherein said second potential is ground.

16. The integrated circuit architecture of claim 13, wherein said first potential is ground.

17. The integrated circuit architecture of claim 16, wherein said second potential is Vcc.

18. A hybrid dedicated and field programmable integrated circuit architecture comprising:

a plurality of pads;

a plurality of input/output buffers of a dedicated portion of said integrated architecture;

a first voltage bus connected to a first one of said plurality of said pads at a first potential and to first selected ones of said plurality of input/output buffers;

a second voltage bus connected to a second one of said plurality of said pads at a second potential and to said first selected ones of said plurality of input/output buffers;

a second selected one of said plurality of input/output buffers connected to a third one of said plurality of said pads at said first potential; and a third selected one of said plurality of input/output buffers connected to a fourth one of said plurality of said pads at said second potential.

19. The integrated circuit architecture of claim 18, wherein said first potential is Vcc.

20. The integrated circuit architecture of claim 18, wherein said first potential is ground.

21. The integrated circuit architecture of claim 20, wherein said second potential is ground.

* * * * *